United States Patent [19]

Emery et al.

[11] Patent Number: 4,817,477
[45] Date of Patent: Apr. 4, 1989

[54] APPARATUS AND METHOD OF AUTOMATICALLY PUNCHING HOLE PATTERNS IN SHEETS OF MATERIAL

[75] Inventors: Jack K. Emery, Santa Ana; Michael B. Dent, Fullerton, both of Calif.

[73] Assignee: C.A. Picard, Inc., Battle Creek, Mich.

[21] Appl. No.: 944,467

[22] Filed: Dec. 19, 1986

[51] Int. Cl.$^4$ .......................... B26D 5/32; B26D 5/34
[52] U.S. Cl. ............................................ 83/23; 83/55; 83/80; 83/210; 83/364; 83/365; 83/371; 83/418
[58] Field of Search ....................... 83/23, 50, 55, 210, 83/80, 144, 150, 111, 364, 365, 367, 371, 418

[56] References Cited

U.S. PATENT DOCUMENTS

| | | | |
|---|---|---|---|
| 1,080,138 | 12/1913 | Coe | 83/149 |
| 3,469,482 | 9/1969 | Lee | 83/365 |
| 3,656,232 | 4/1972 | Hinchey | 29/624 |
| 3,699,832 | 10/1972 | Smith et al. | 83/367 X |
| 3,831,250 | 8/1974 | Holiday | 29/407 |
| 3,933,069 | 1/1976 | Tall et al. | 83/367 X |
| 4,163,405 | 8/1979 | Diesch et al. | 83/365 X |
| 4,171,162 | 10/1979 | Gerard et al. | 356/401 |
| 4,222,036 | 9/1980 | Troukens | 340/286 M |
| 4,325,077 | 4/1982 | Dunham | 358/107 |
| 4,404,741 | 9/1983 | Lebet et al. | 29/721 |
| 4,481,533 | 11/1984 | Alzmann et al. | 358/101 |
| 4,552,608 | 11/1985 | Hoffmann et al. | 83/367 X |
| 4,555,968 | 12/1985 | Raney et al. | 83/367 X |
| 4,641,828 | 12/1987 | Yajima | 83/367 X |

Primary Examiner—Frank T. Yost
Assistant Examiner—Rinaldi Rada
Attorney, Agent, or Firm—Knobbe, Martens, Olson & Bear

[57] ABSTRACT

A method of punching patterns of holes in printed circuit boards and sheets of material used in the manufacture of printed circuit boards. Each hole pattern punched is precisely positioned with respect to the metallized circuitry or the photographic image of the circuitry on each sheet of material. This method is accomplished with the use of an optical registration punch which automatically positions each sheet of material and punches a pattern of holes therein at a precise position with respect to the circuitry or the image of the circuitry on each sheet of material.

10 Claims, 12 Drawing Sheets

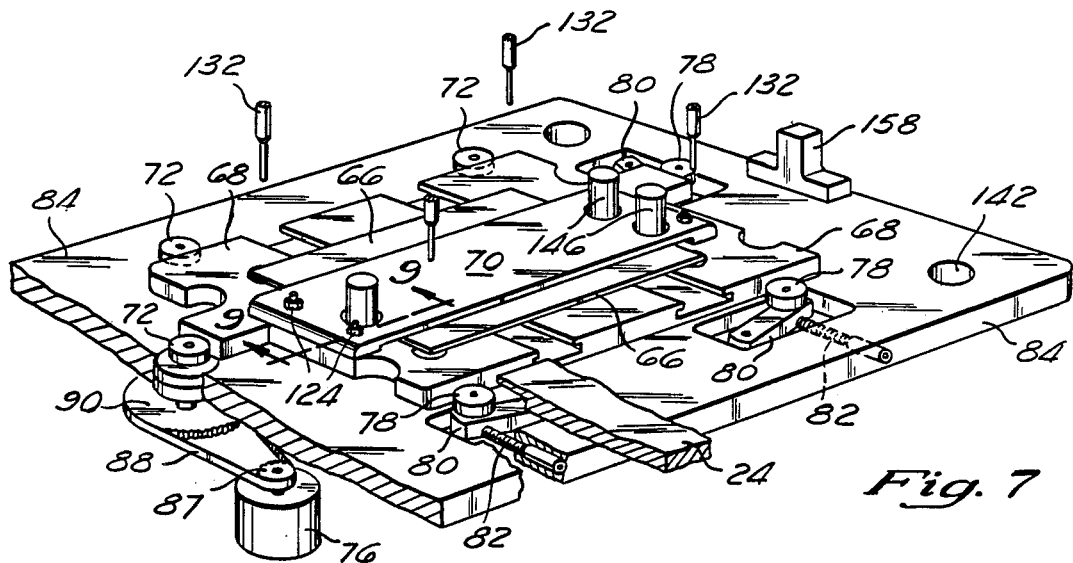

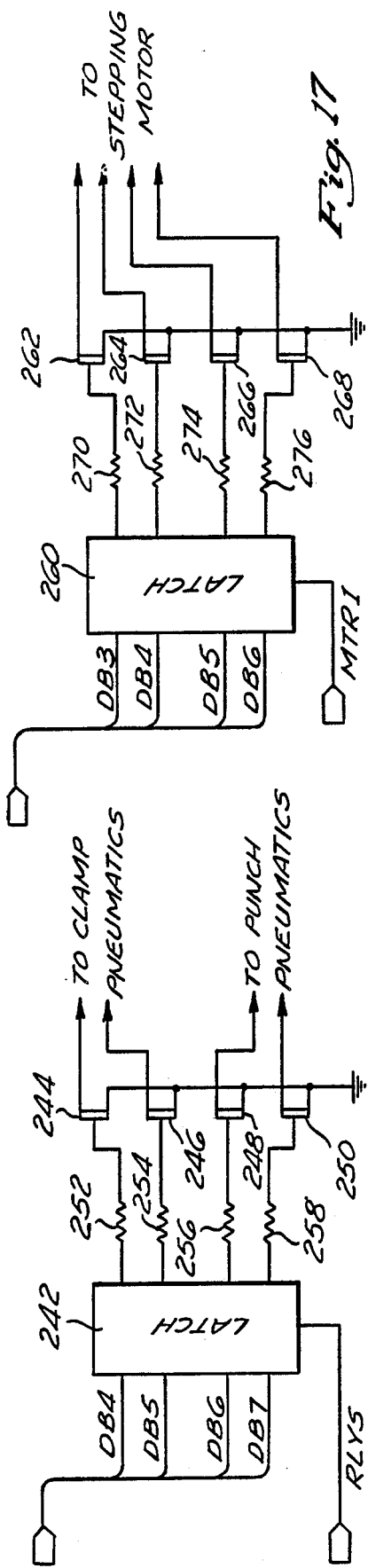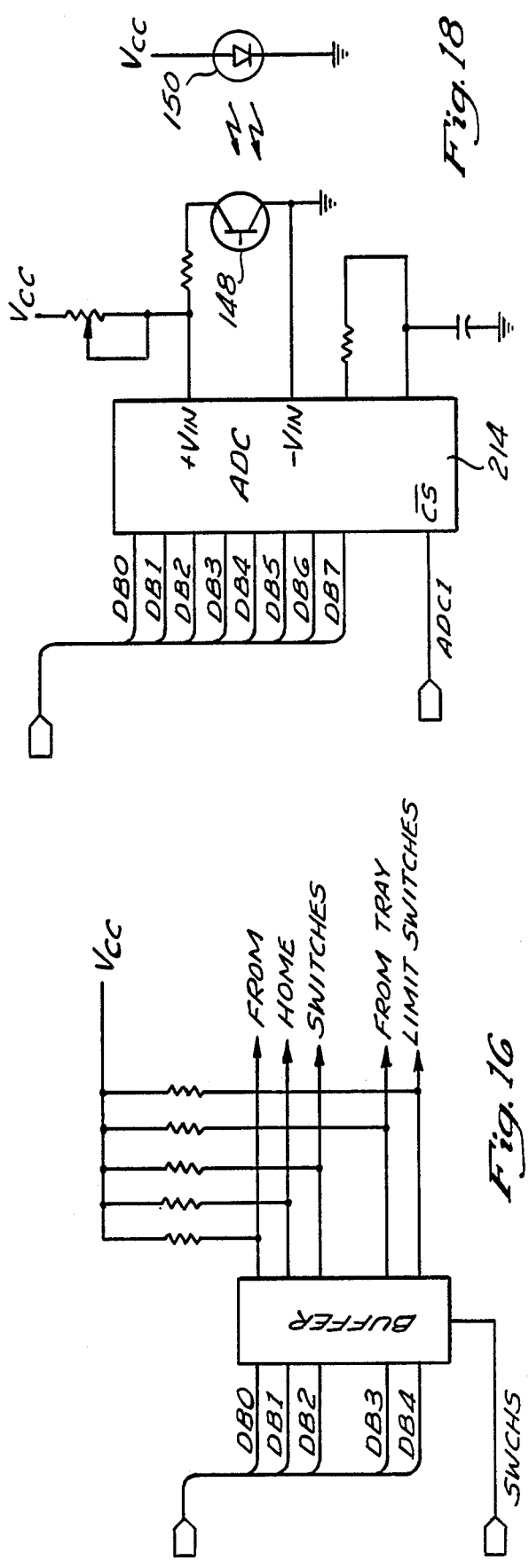

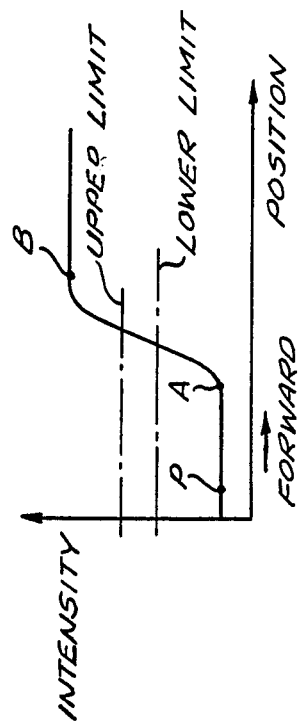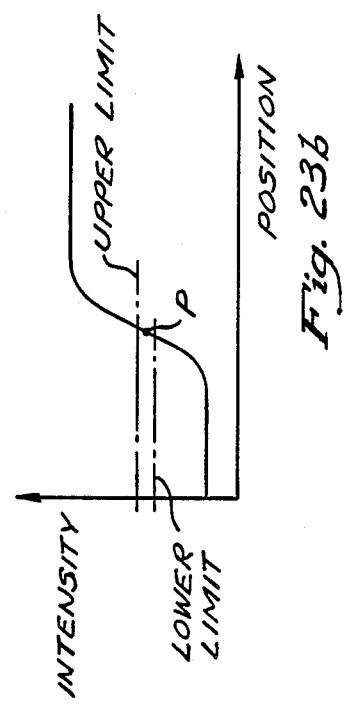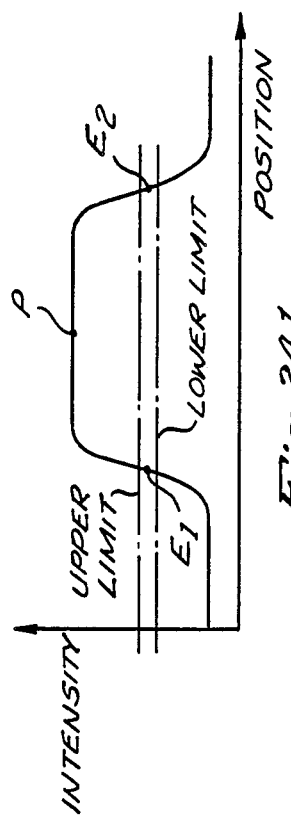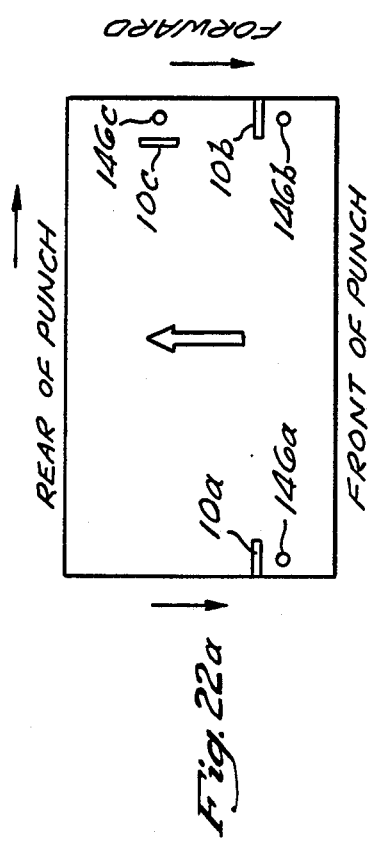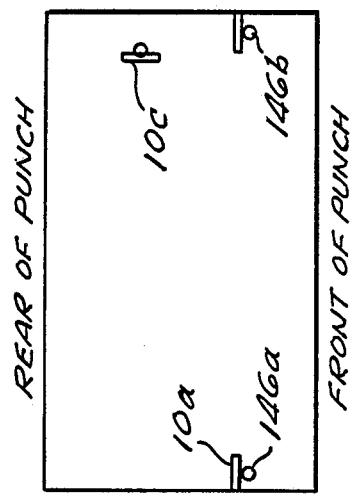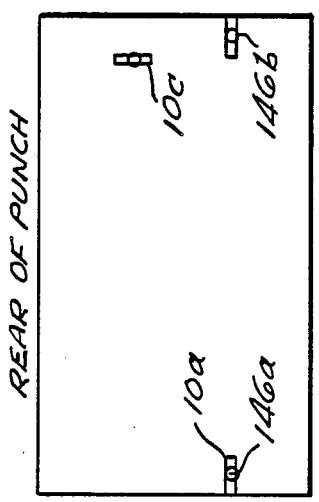

APPARATUS AND METHOD OF AUTOMATICALLY PUNCHING HOLE PATTERNS IN SHEETS OF MATERIAL

BACKGROUND OF THE INVENTION

The present invention relates to a method and apparatus for automatically punching predetermined hole patterns at precise locations in sheets of material, and more particularly to a method and apparatus for automatically punching predetermined hole patterns at precise locations in printed circuit boards and sheets of material used in the manufacture of printed circuit boards.

A single layer printed circuit board consists of an insulating sheet of material which has a metallized circuitry pattern formed thereon. It is desirable to punch a pattern of holes in the printed circuit board at a precise location with respect to the metallized circuitry so that electronic components may be automatically mounted in various positions on the board by making reference to the precisely positioned holes in the board. The holes may also be used for other alignment purposes.

A multilayer printed circuit board consists of a plurality of interleaved laminate sheets of material, each of which usually has a metallized circuitry pattern on each of its two sides. A multilayer board is manufactured by a process having two basic steps. First, a desired circuitry pattern is formed on each side of each laminate sheet of material to be incorporated in the multilayer board. Second, the laminate sheets of materials having the metallized circuitry formed thereon are interleaved with insulating sheets of material, and then all the sheets are subject to high temperature and pressure in order to bond them together to form the multilayer board.

It is important that the laminate layers making up the multilayer printed circuit board be precisely aligned, or "registered," at the time they are bonded together. To this end, prior to bonding, a predetermined pattern of alignment holes is punched in each laminate layer, and then all the laminate layers are registered via their alignment hole patterns while being bonded together. As a result, each circuitry pattern in the finished multilayer circuit board will be properly registered. Otherwise, the multilayer board may not function properly.

Circuitry is formed on single layer printed circuit boards and laminate sheets of material used in multilayer boards by a conventional photoetching process. In this process, a sheet of material called a photoprint film is placed over a sheet of insulating material having a copper coating on each of its sides covered by a photosensitive emulsion layer. The photoprint film, depending upon the particular process used, has either a negative or a positive photographic image of the desired circuitry pattern which selectively passes ultraviolet light. When the photosensitive emulsion layer on the insulating sheet is exposed to ultraviolet light through the photoprint film, the emulsion layer is selectively hardened so that the remaining unhardened emulsion can be washed away from the copper surface on the insulating sheet. At this point, the portions of the copper surface which are not covered by the hardened emulsion can be chemically washed away so that the desired copper circuitry pattern remains on the sheet of insulating material.

When circuitry is formed on both sides of an insulating sheet of material, a pair of photoprint films is used, one film being placed on either side of the sheet of material on which the circuitry will be formed. It is necessary to register the two films during the photoetching process so that the metallized circuitry patterns so produced will also be registered. To this end, a predetermined hole pattern is punched in each photoprint film at a precise location with respect to the image of the circuitry pattern on the film, and then the two films are aligned via their hole patterns so that their respective circuitry images are in registration.

Thus, as described above, it is desirable and sometimes necessary to punch hole patterns at predetermined locations in printed circuit boards, laminate sheets of material used in multilayer circuit boards, and photoprint films used in connection with the manufacture of printed circuit boards. In the past, systems have been used to accomplish the punching of holes at precise locations in sheets of material. One such system is described in U.S. Pat. No. 4,481,533. However, this system is a complicated and expensive system requiring the use of television cameras and television monitors.

SUMMARY OF THE INVENTION

It is an object of this invention to provide a relatively inexpensive, automatic apparatus for punching predetermined hole patterns at precise locations in sheets of material.

In one aspect, the invention provides an apparatus for punching holes at precise locations in sheets of material. The apparatus includes a photoemitter for emitting light on a sheet of material. A photodetector is positioned to detect the light emitted by the photoemitter, the intensity of the light detected being indicative of the relative position of the sheet of material in the punching apparatus. The apparatus also includes an automatic sheet positioner which automatically positions the sheet of material in repsonse to the intensity of the light detected by the photodetector. Upon sensing a predetermined intensity of light, a punch punches a pattern of holes in the sheet of material.

In another aspect, the invention provides a method of automatically punching holes at precise locations in sheets of material. The method includes emitting light on a sheet of material and detecting the emitted light, the intensity of the emitted light being indicative of a feature of the sheet of material. The sheet of material is automatically positioned in response to the amount of light detected. Upon a predetermined amount of light being detected, a pattern of holes is punched in the sheet of material.

The objects, features, and advantages of this invention will be apparent in view of the following detailed description of several preferred embodiments, which are explained with reference to the figures, a brief description of which is provided below.

BRIEF DESCRIPTION OF THE DRAWINGS

FIG. 7 is a perspective view of the sheet positioning system of the punch of FIG. 1 with portions removed for purposes of clarity;

FIG. 9 is a cross-sectional view of one of the clamping assemblies of the punch of FIG. 1;

FIG. 10 is a cross-sectional view of one of the stepping motors and cam assemblies of the punch of FIG. 1;

FIG. 11 is a perspective view of an embodiment of a photosensing system;

FIG. 15 is a circuit diagram of the driver of FIG. 12;

FIG. 16 is a circuit diagram of the buffer of FIG. 12;

FIG. 17 is a circuit diagram of one of the motor drivers of FIG. 12;

FIG. 18 is a circuit diagram of one of the A/D converters of FIG. 12;

FIG. 22a is a top view of the starting position of a sheet of material with respect to the photosensors of the punch of FIG. 1;

FIG. 22b is a graph of light intensity versus the position of the sheet of material in FIG. 22a;

FIG. 23a is a top view of one final position of a sheet of material with respect to the photosensors of the punch of FIG. 1;

FIG. 23b is a graph of light intensity versus the position of the sheet of material in FIG. 23a;

FIG. 24a is a top view of a second final position of a sheet of material with respect to the photosensors of the punch of FIG. 1; and FIG. 24b is a graph of light intensity versus the position of the sheet of material in FIG. 24a.

DETAILED DESCRIPTION OF SEVERAL PREFERRED EMBODIMENTS

Figure 1:
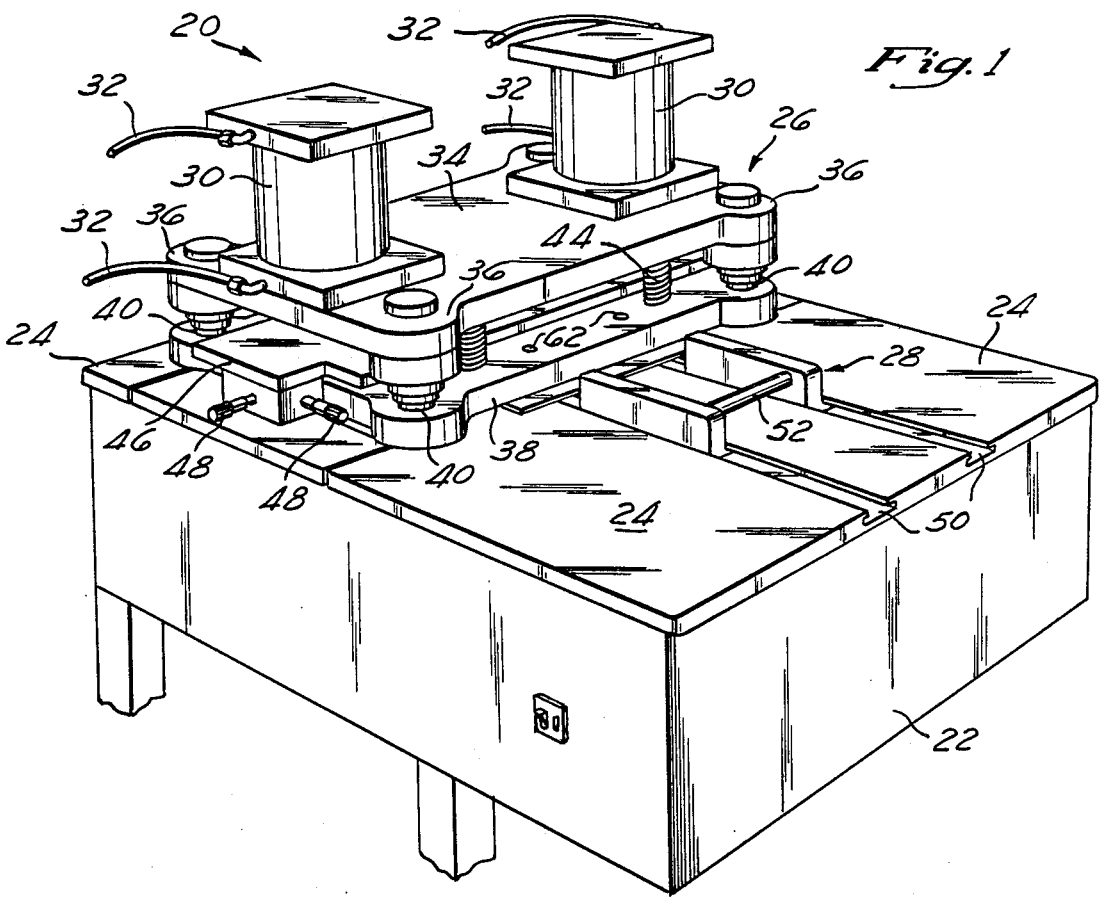
FIG. 1 illustrates a preferred embodiment of an optical registration punch in accordance with the invention.

An optical registration punch 20 in accordance with the invention is illustrated in FIG. 1. The punch 20 automatically punches holes at precise locations in sheets of material, including printed circuit boards and sheets of material used in the manufacture of printed circuit boards, as described above. The sheets of material are manually inserted into the punch by an operator. After each sheet of material is so inserted, the punch automatically positions the sheet of material by optically detecting three reference marks 10 located on the sheets of material. When the sheet of material is properly positioned in this manner, the punch simultaneously punches holes in the sheet of material in a number of predetermined locations. After the holes are punched, the operator inserts another sheet of material in the punch. Upon the insertion of the new sheet of material, the punched sheet is automatically ejected from the punch. The punch automatically punches holes in the new sheet of material in accordance with the procedure just described.

The optical registration punch 20 shown in FIG. 1 comprises a base 22, a segmented base plate 24 on top of the base 22, a pneumatic punching mechanism 26 and a tray 28 for loading sheets of material to be punched into the punching mechanism 26. The punching mechanism 26 comprises a pair of cylinders 30 each having a pair of attached pneumatic lines 32. The cylinders 30 are mounted on a large rectangular top plate 34 with curved protruding corners 36 which is horizontally aligned with a stripper plate 38 of a similar shape by four guide rods 40. Each of the cylinders 30 houses a reciprocating piston rod 42 (shown in FIG. 8) for moving the stripper plate 38 and the top plate 34 together and apart to facilitate the punching of holes in sheets of material. Four springs 44 are connected between the top plate 34 and the stripper plate 38 for urging the two plates 34,38 apart. Also mounted between the two plates 34,38 is a sensor adjustment plate 46 having a plurality of micrometers 48 attached. As described in more detail below, the micrometers 48 are used to finely adjust the position of the sensor adjustment plate 46 relative to the position of the stripper plate 38.

Figure 2:
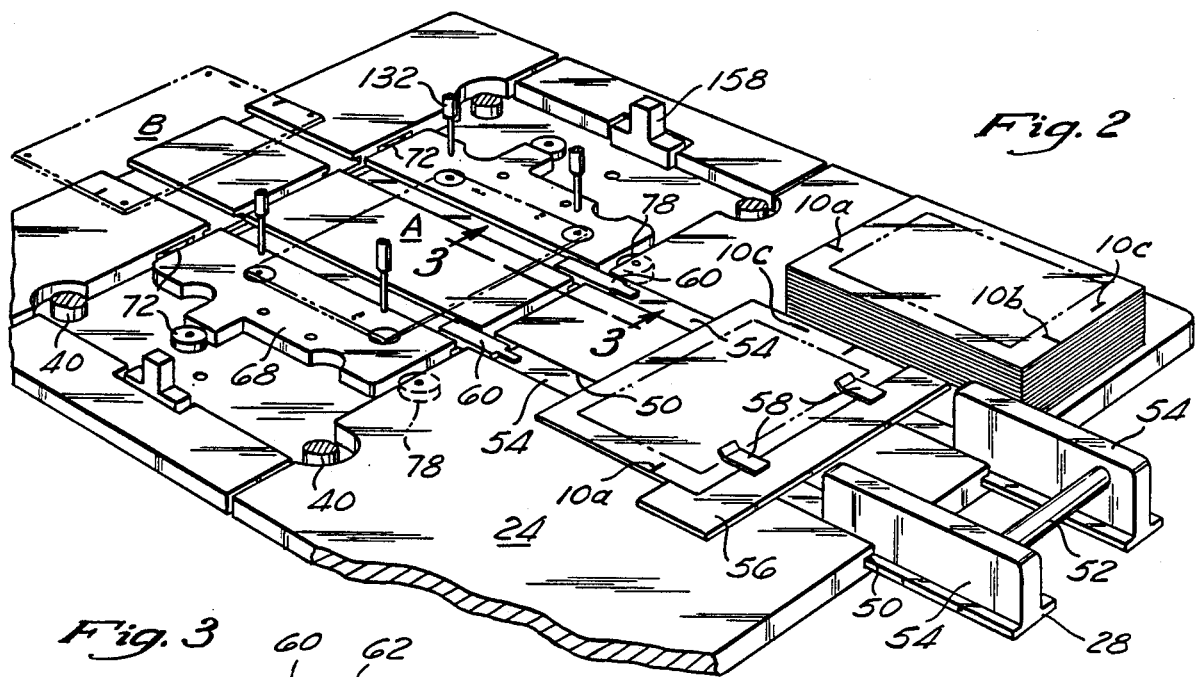
FIG. 2 is a view of the sheet handling and positioning systems of the punch of FIG. 1 with portions removed for purposes of clarity.
Figure 3:
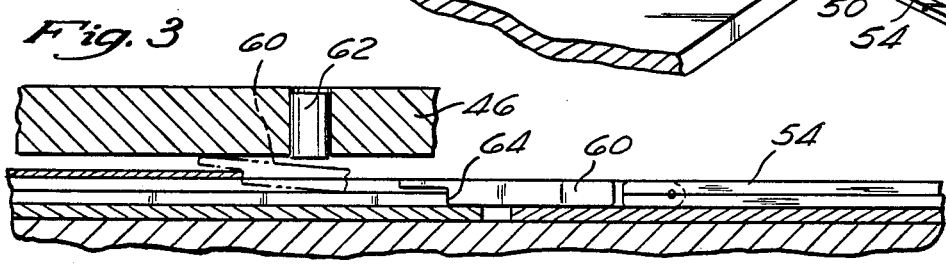
FIG. 3 is a cross-sectional side view of a portion of the handling system taken along lines 3—3 in FIG. 2.

The base plate 24 has a pair of tray guide slots 50 in which the tray 28 may be linearly displaced with the aid of a handle 52. The tray 28, shown in more detail in FIG. 2, comprises two tray guides 54 interconnected by the handle 52. The tray 28 also includes an L-shaped sheet guide 56 having a pair of spring clamps 58 attached to its top surface for holding a sheet of material in place against the interior edges of the sheet guide 56. The two tray guides 54 slidably mounted within the guide slots 50 extend past the sheet guide 56 and have a pair of pivotal sheet ejectors 60 attached at their ends. The sheet ejectors 60, which also ride within the guide slots 50, are used to automatically eject a sheet of material from the punching chamber within the punching mechanism 26 upon the insertion of a new sheet of material by the operator. As shown in FIG. 1, each of a pair of magnets 62 is positioned directly above one of the two tray guide slots 50. Now referring to FIG. 3, when the tray 28 is pushed towards the punching mechanism 26, the pivotal sheet ejectors 60 are picked up out of the two guide slots 50 by the force of magnetic attraction as they pass beneath the magnets 62. When the sheet ejectors 60 are pivoted upwards in this manner, a lower recessed edge 64 on each of the ejectors 60 abuts against the edge of the sheet of material and pushes the sheet of material out of the punching chamber of the punching mechanism. This process is shown in FIG. 2. A punched sheet of material is shown within the punching chamber at position A, and a new sheet of material is shown placed in the tray 28 against the sheet guide 56. As the new sheet of material is inserted into the punching chamber by the operator, the sheet ejectors 60 are picked up by the magnets 62 and the already punched sheet is moved from position A within the punching chamber to position B outside the punching chamber.

Figure 4:
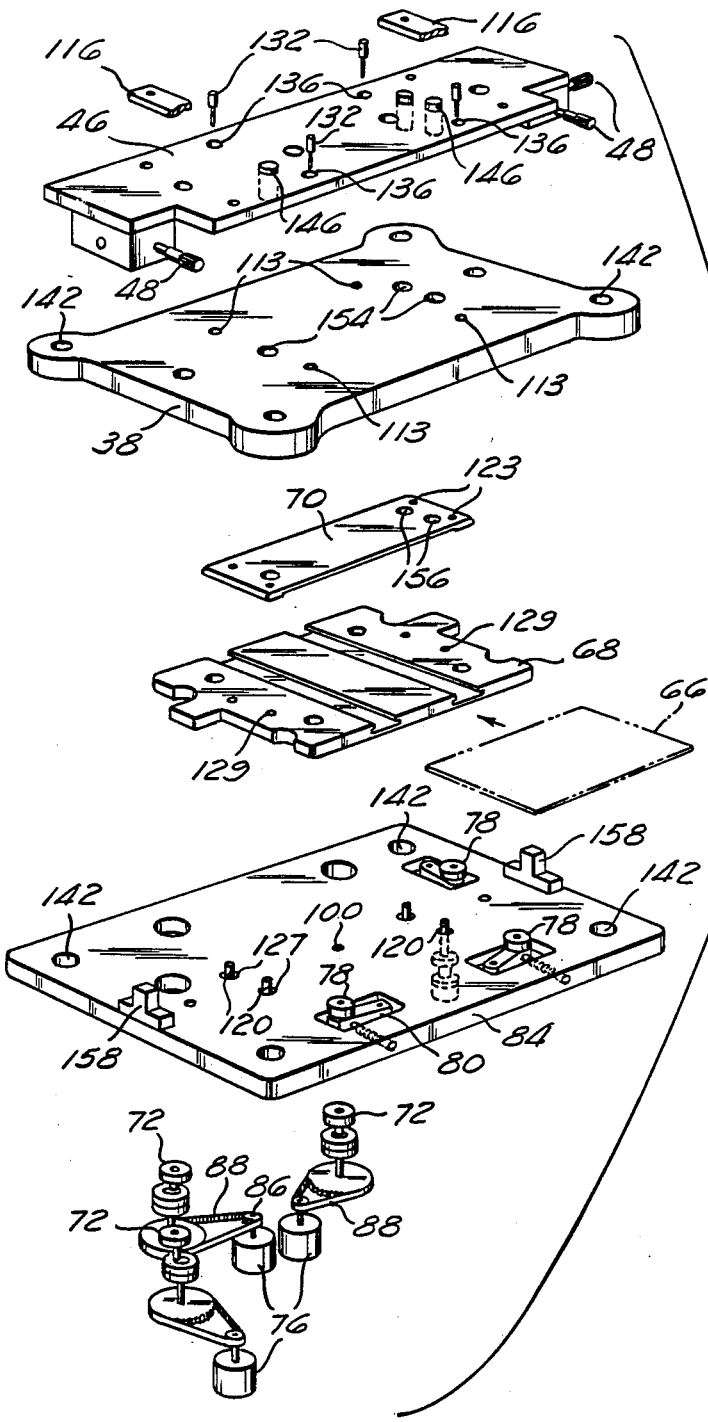
FIG. 4 is an exploded perspective view of the punching mechanism of the punch of FIG. 1.
Figure 6:
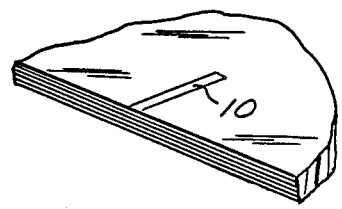
FIG. 6 is a perspective view of an edge portion of a multilayer printed circuit board.

An important feature of the punch 20 is the automatic positioning of a sheet of material after it is inserted into the punching chamber and prior to the punching of holes therein. As described above, the punch automatically positions sheets of material by detecting the location of a number of reference marks on each sheet of material. Now referring to FIG. 7, a sheet of material 66 is shown clamped within the punching chamber on top of a sheet positioning plate 68 and underneath a clamp plate 70. The clamp plate 70 and the sheet positioning plate 68 are located below the stripper plate 38, as indicated by FIG. 4. When clamped to the sheet positioning plate 68, the sheet of material 66 is held firmly and does not move relative to the sheet positioning plate 68.

The sheet positioning plate 68 is horizontally moved within the punch by three circular positioning cams 72 which abut against two of its sides. Each of the three cams 72 is connected to a respective one of three eccentrics 74 (FIG. 10) which is rotatable by a respective one of three stepping motors 76. As explained below, the rotation of each stepping motor 76 causes the horizontal position of its respective cam 72 to be incrementally changed. The sheet positioning plate 68 is held firmly against the three positioning cams 72 by three tensioning cams 78 rotatably coupled to three pivotal spring-loaded levers 80. Three springs 82 urge the levers 80 and, in turn, the tensioning cams 78 against the side of the sheet positioning plate 68 in a direction towards the three positioning cams 72. As a result, the three positioning cams 72 control the position of the sheet positioning plate 68.

One of the three positioning cam and stepping motor assemblies is illustrated in FIG. 10. The stepping motor 76 is mounted to the underside of a die plate 84 which lies beneath the sheet positioning plate 68. The spindle 86 of the stepping motor 76 has a gear 87 which is connected by a drive belt 88 to a gear 90 fixed to an axle portion 92 of the eccentric 74. The offset portion 94 of the eccentric 74 is rotatably coupled to the positioning cam 72 by a bearing assembly (not shown). When the motor spindle 86 is driven, the eccentric 74 is rotated, causing the horizontal position of the cam 72 to be incrementally changed. As a result, the position of the sheet positioning plate 68 is also incrementally changed. The sheet positioning plate 68 is easily movable on top of the die plate 84 because the positioning plate 68 rides on a thin cushion of air, or air bearing, produced between the two plates 68, 84 by a bore 100 in the die plate 84 fluidly connected to a pressurized pneumatic line 102 (shown in FIG. 8).

Figure 8:
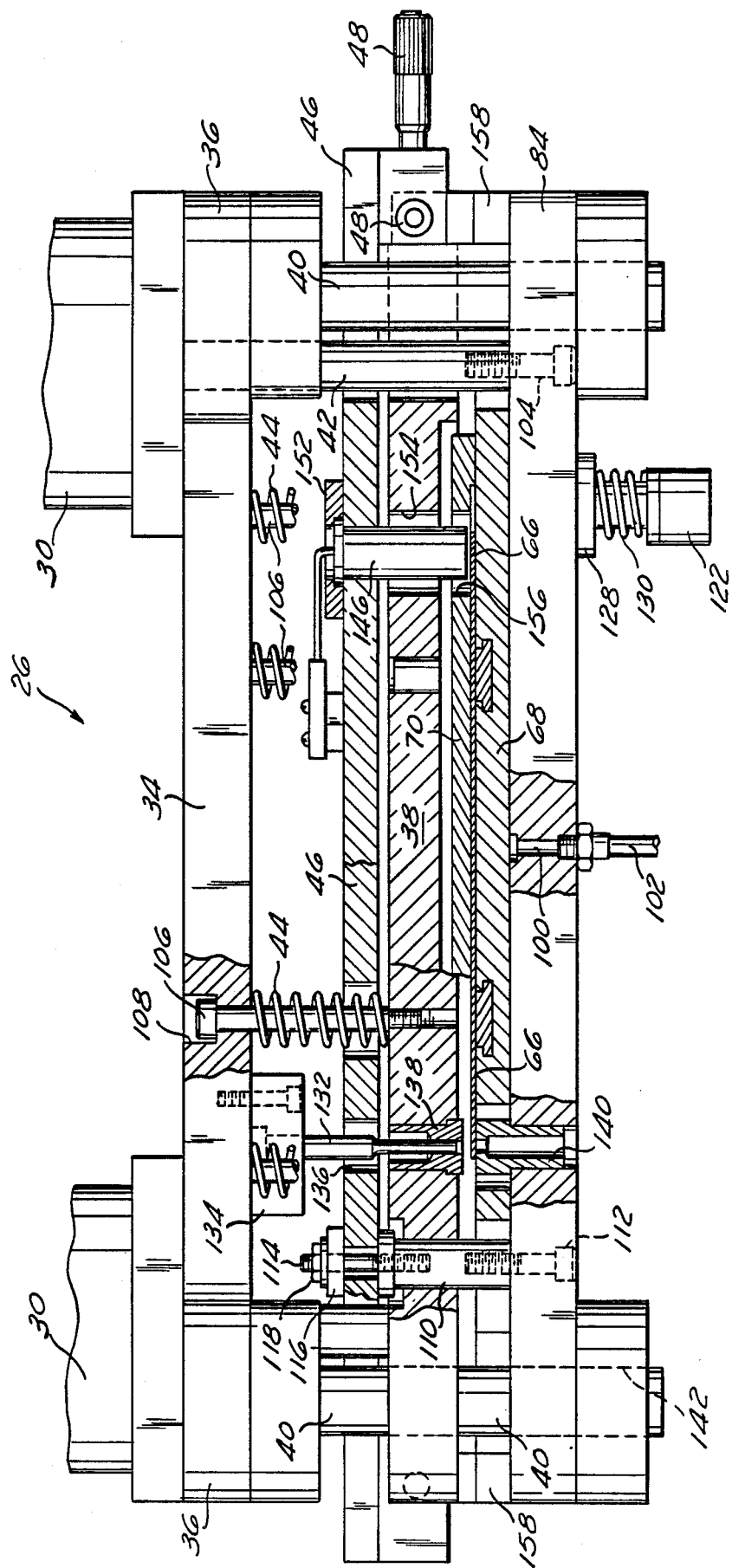
FIG. 8 is a staggered cross-sectional view of the punch of FIG. 1 with portion removed for purposes of clarity.

The punching mechanism 26 is explained with reference to FIG. 8, which is a staggered cross-sectional side view of the punching mechanism with some elements not shown for purposes of clarity. As shown in FIG. 8, the top plate 34 and the die plate 84 are interconnected by the two piston rods 42, one of which is clearly shown in the right-hand portion of FIG. 8. The piston rods 42 are secured to the die plate 84 by a pair of mounting bolts 104. When the air pressure within the cylinders 30 is appropriately changed, the top plate 34 is raised and lowered with respect to the stationary die plate 84.

The stripper plates 38 is supported above the clamp plate 70 and below the sensor adjustment plate 68 by a plurality of bolts 106 which rest in a plurality of counterbores 108 in the top of the top plate 34. The bolts 106 are threaded into the stripper plate 38 through the springs 44 which urge the top plate 34 and the stripper plate 38 apart. The length of the bolts 106 is such that the stripper plate 38 is supported slightly above the clamp plate 70 and the sheet positioning plate 68, which are shown in clamped position in FIG. 8. This gap between the two plate 38, 70 allows upward movement of the clamp plate 70 during unclamping.

The sensor adjustment plate 46 is fixedly supported at its corners above the die plate 84 by four standoffs 110, each of which is mounted through a respective bore 113 in the stripper plate 38. Each of the standoffs 110 is mounted to the top of the die plate 84 by a respective bolt 112. The sensor adjustment plate 46 is mounted to the top of each of ths standoffs 110 by a respective bolt 114 threaded at both ends. One end of each of the bolts 114 is threaded into the standoff 110 and the other end of each of the bolts 114 extends through one of two metal locking straps 116 which lie across the width of the sensor adjustment plate 46. Each of the two locking straps 116 is firmly held against the top of the sensor adjustment plate 46 by four nuts 118.

The air bearing formed between the die plate 84 and the sheet positioning plate 68 which facilitates the horizontal movement of the positioning plate 68 by the three positioning cams 72 is provided by the pneumatic line 102 through the bore 100 in the die plate 84. The sheet of material 66 is shown clamped between the clamp plate 70 and the sheet positioning plate 68. During positioning, the three cams 72 which abut the sheet positioning plate 68 also move the sheet of material 66 and the clamp plate 70, as described above, since the clamp plate 70 is firmly clamped to the sheet positioning plate 68 by four piston rods 120, which will be described in connection with FIG. 9.

As shown in FIG. 9, the clamp plate 70 and sheet positioning plate 68 are connected to one of the piston rods 120 which is linearly displaceable within a cylinder 122. The piston rod 120 is threaded into a bore 123 in the clamp plate 70 and secured by a nut 124. The piston rod 120 is also displaceable within a piston rod housing 126 passing through a bore 127 in the die plate 84. The upper portion of the housing 126 is threaded into a bore 129 in the sheet positioning plate 68. The piston rod housing 126 passes through a flat cylindrical sleeve 128 which is supported on the underside of the die plate 84 by a spring 130. The piston rod housing 126 is translated slightly upwards through the sleeve 128 when the air bearing is formed above the die plate 84.

In order to clamp the sheet of material 66, air is pressurized within the cylinder 122 so that the piston rod 120 is forced downwardly, drawing the clamp plate 70 firmly against the sheet of material 66 and the sheet positioning plate 68. When the sheet of material 66 is unclamped, the piston rod 120 is forced upwardly, forcing the clamp plate 70 upwards by its threaded portion. As shown in FIG. 7, each corner of the clamp plate 70 is connected to a respective piston rod 120 and nut 124 of the clamping assembly described in connection with FIG. 9.

Now referring back to FIG. 8, one of four punch bits 132 is shown supported against the underside of the top plate 34 by a cylindrical holder block 134 bolted to the underside of the top plate 34. The holder block 134 supports the punch bit 132 so that it does not move relative to the top plate 34. The punch bit 132 passes through a bore 136 of a larger diameter in the sensor adjustment plate 46 and is translatable through a bit guide 138 mounted in the stripper plate 38. During the punching operation, each of the four punch bits 132 passes through the sheet of material 66 and also into a respective die bushing 140 mounted in the die plate 84. In order to keep the punch bit 132 aligned with the bit guide 138 in the stripper plate 38 and the bushing 140 in the die plate 84, each of the plates 34, 38, 84 is coupled to the four precision tolerance guide rods 40 which pass through a precision bore 142 in each corner of the plates. Since the four guide rods 40 prevent any significant horizontal movement of the top plate 34, the stripper plate 38 and the die plate 84, the punch bits 132 are always properly aligned with respect to their respective bit guides 138 and die bushings 140.

The movement of the plates during the punching operation is described with reference to FIG. 8. At the beginning of the punching operation, the top plate 34 and the two attached cylinders 30 begin to move downwards over the two piston rods 42. Since the stripper plate 38 is supported by the bolts 106, the stripper plate 38 also moves downward with the top plate 34 until it reaches the top of the clamp plate 70. At this point, as the top plate 34 moves further downward, the bolts 106 "rise" out of their respective counterbores 108 and the top plate 34 begins to compress the four springs 44. The four punch bits 132, which move with the top plate 34, then begin to move downwards with respect to their bit guides 138. As the downward movement of the top plate 34 continues, the four punch bits 132 are driven through the sheet of material 66, thus punching four holes in its corners. The punch bits 132 are driven into their respective bushings 140, forcing the punched material to exit the bottoms of the bushings 140. The air pressure is then reversed, raising the top plate 34 and the stripper plate 38 until the punch returns to its original position as shown in FIG. 8.

Figure 5:
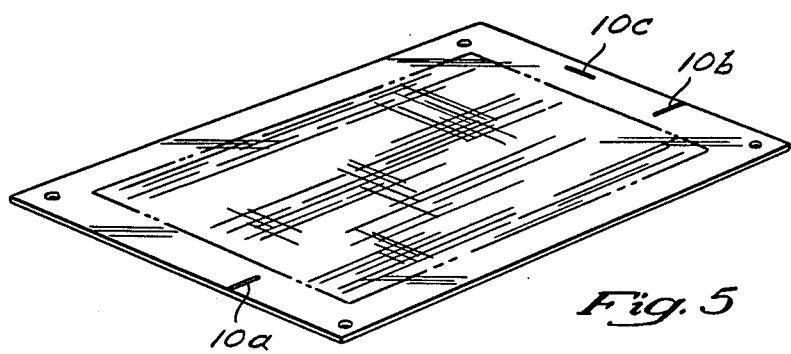
FIG. 5 is a perspective view of a sheet of material with metallized circuitry formed thereon.

Before a sheet of material is punched, the sheet of material is precisely positioned within the punch with respect to its three reference marks 10 by the positioning system described in connection with FIG. 7. As shown in FIG. 5, each sheet of material has three reference marks 10. Two of the reference marks 10a, 10b are aligned in a first direction, and the third reference mark 10c is aligned in a second direction perpendicular to the first direction. The reference marks 10 are metallic and are formed simultaneously with the circuitry in the photoetching process from the same metallic substrate on the sheet of material, as described above. When each sheet of material is inserted into the punching chamber, the sheet guide 56 positions the sheet so that each of the three reference marks 10 lies a predetermined horizontal distance from a respective one of three photosensors 146 mounted to the sensor adjustment plate 46. This initial position of the sheet of material with respect to the photosensors 146 is indicated in FIG. 22a, which is explained in more detail below.

The photosensors 146, which are conventional coaxial fiber optic photosensors such as Model No. S-56104 manufactured by Scan-A-Matic of Elbridge, N.Y., comprise a photodetector 148 and a photoemitter 150 (schematically shown in FIG. 18). The photodetector 148 in each photosensor 146 is positioned to receive the light emitted by the photoemitter 150 after the light is reflected from a surface, in this case, the sheets of material with the reference marks 10. As will be explained in more detail below, the photosensors 146 can detect the relative position of metallized reference marks 10 because they reflect more light than the surrounding areas on the sheet of material.

Now referring to FIG. 8, one of the photosensors 146 is shown mounted to the sensor adjustment plate 46 by means of a sensor locking plate 152. The end of the photosensor 146 is positioned slightly above the sheet of material 66. The photosensor 146 passes through a bore 154 in the stripper plate 38 and a bore 156 in the clamp plate 70. The diameter of the bore 156 is larger than the diameter of the photosensor 146 to allow horizontal movement of the clamp plate 70 during automatic positioning of the sheet of material. The bore 154 diameter is larger in order to allow the position of the three photosensors 146 to be adjusted with respect to the punch bits 132.

This adjustment of the photosensors 146 is explained with reference to FIG. 8. The ends of the micrometers 48 abut against a pair of adjustment blocks 158 extending upwardly from the die plate 84. The adjustment blocks 158 are shown in perspective in FIG. 4. Rotation of the micrometers 48 acts to move the sensor adjustment plate 46 with respect to the die plate 84 and the top plate 34 held in strict horizontal alignment thereto. Thus, the position of the three photosensors 146 are adjustable with respect to the four punch bits 132. Before adjustment, the metal locking straps 116 over the sensor adjustment plate 46 are loosened to permit horizontal movement of the plate 46, and are then tightened after the sensors 146 are adjusted to prevent any positional drift of the sensor adjustment plate 46 during the processing of sheets of material.

Figure 12:
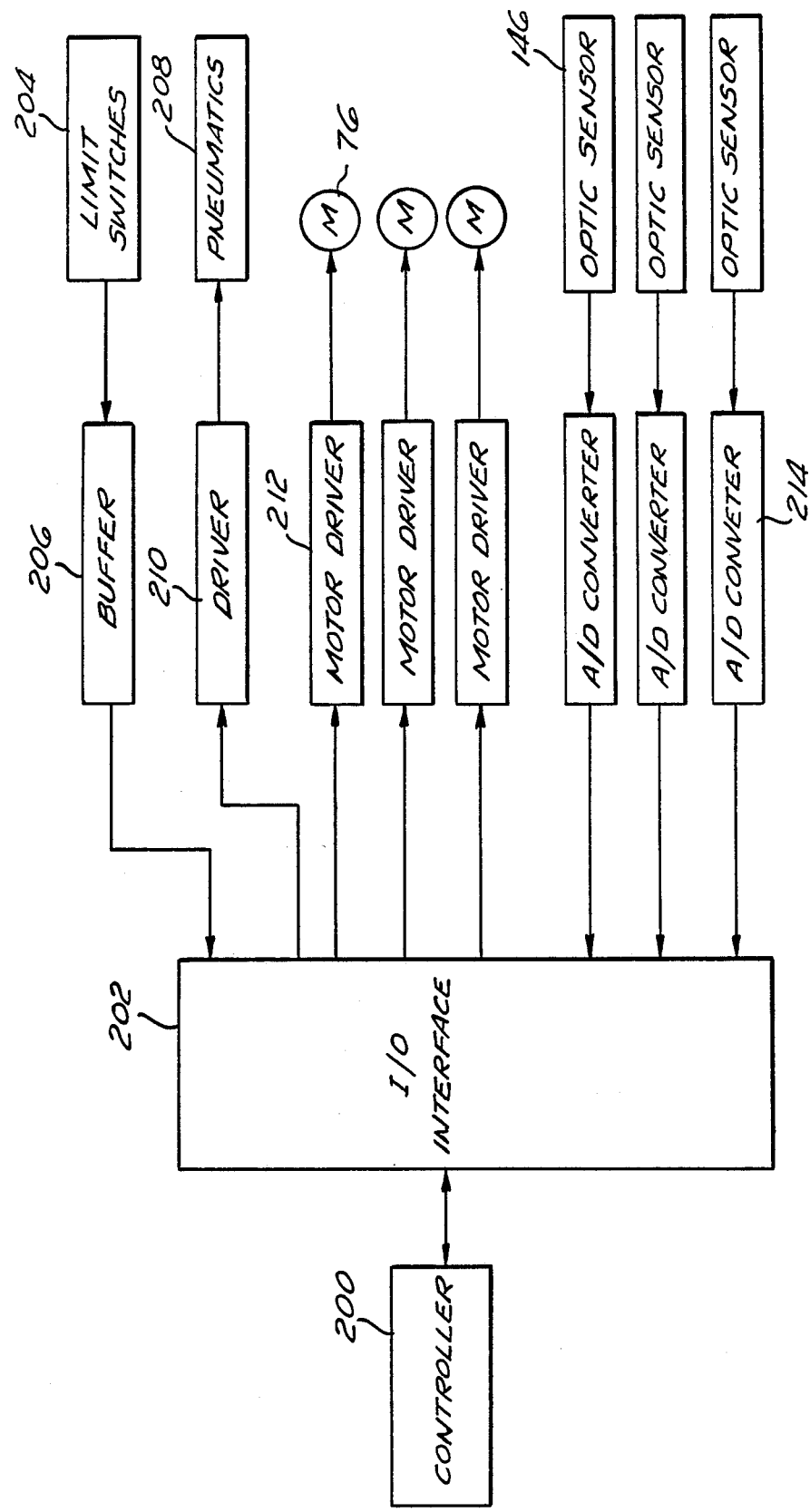
FIG. 12 is an overall functional diagram of the electronics of the punch of FIG. 1.

An overall functional diagram of the electronics of the optical registration punch 20 is illustrated in FIG. 12. A controller 200 controls the automatic operations of the punch 20 through an input/output ("I/O") interface 202. The I/O interface 202 is coupled to a plurality of limit switches 204 including three home switches (not shown) and two tray-in and tray-out switches (not shown) through a buffer 206. The pneumatics 208 which effect the clamping of and the punching of holes in the sheets of material are coupled to the controller 200 through a driver 210. The three stepping motors 76 used to position sheets within the punch have respective motor drivers 212. The signals from the photosensors 146 which detect the reference marks on each sheet of material are supplied to three analog-to-digital ("A/D") converters 214 which are connected to the I/O interface 202.

Figure 13:
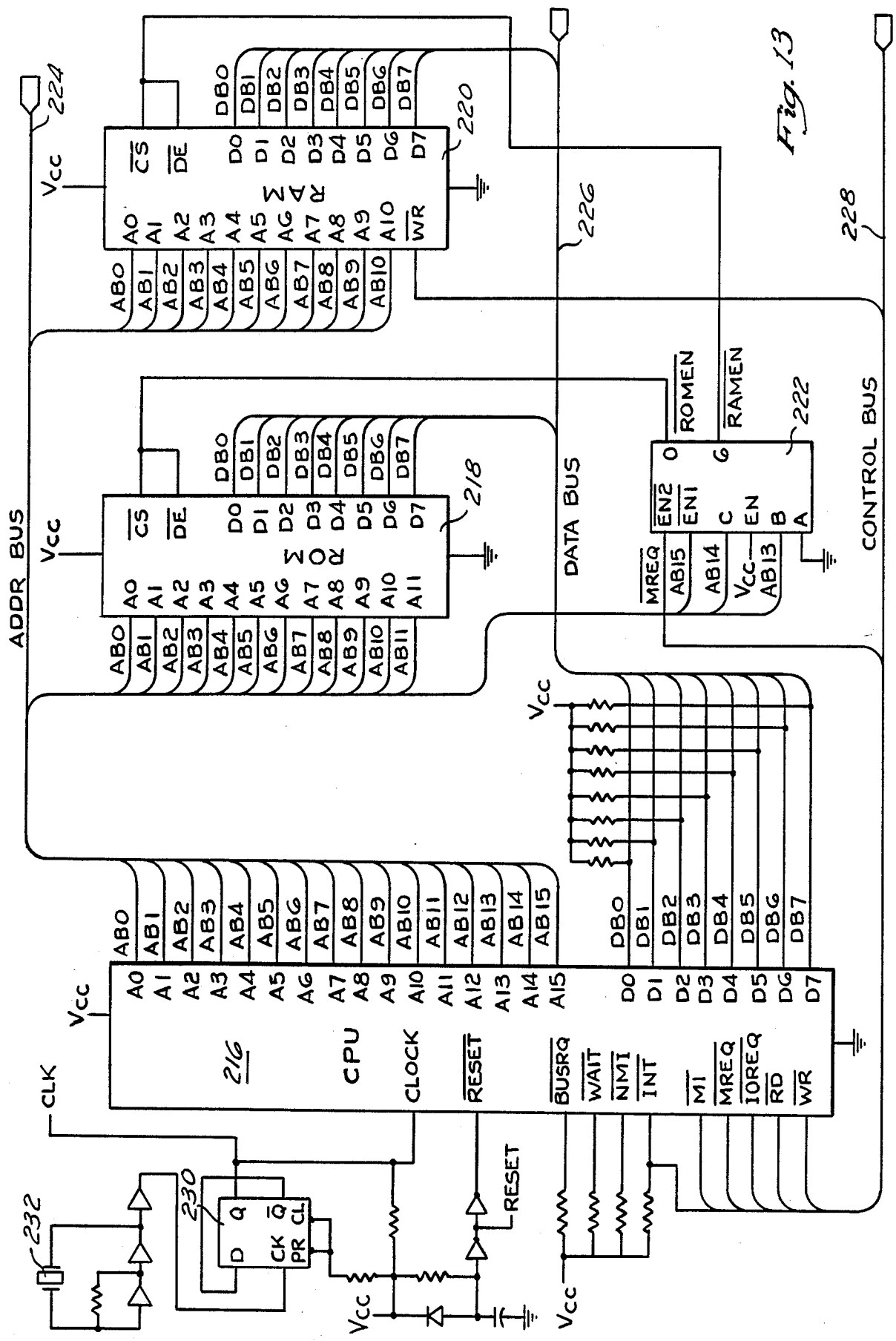
FIG. 13 is a circuit diagram of the controller of FIG. 12.

The controller 200 is the "brains" of the punch and controls all of its automatic operations. A detailed circuit diagram of the controller 200 is shown in FIG. 13. The principal elements of the controller 200 are a central processing unit ("CPU") 216, a read-only memory ("ROM") 218 and a random access memory ("RAM") 220. A memory select chip 222 is connected between the CPU, the ROM, and the RAM. The purpose of the select chip 222 is to selectively activate either the ROM or the RAM for operation, according to the select chip inputs supplied by the CPU. The CPU, which is a conventional Z80 integrated circuit chip manufactured by Zilog, communicates to the ROM and the RAM by an address ("ADDR") bus 224 and a data ("DATA") bus 226. The ADDR bus 224 consists of sixteen separate address bus ("AB0–AB15") signal lines and the DATA bus 226 consists of eight separate data bus ("DB0–DB7") signal lines. The CPU also utilizes a control bus 228 having a number of control signal lines including a memory instruction fetch ("$\overline{M1}$") signal line, a memory request ("$\overline{MREQ}$") signal line, an input-/output request ("$\overline{IOREQ}$") signal line, a read ("$\overline{RD}$") signal line, and a write ("$\overline{WR}$") signal line. The CPU is driven by a clock ("CLOCK") signal line which is generated by a D flip-flop 230 through an oscillator 232. Throughout this specification, a signal with a bar over its name, e.g., $\overline{RD}$, is active when it is logic "0," which occurs when the signal line has a low voltage. A signal without a bar over its name, e.g., AB0, is active when it is logic "1," which occurs when the signal line has a high voltage, e.g., 5 volts.

Permanently stored in the ROM 218 is a computer program which is executed by the CPU. The CPU fetches and executes the program instructions stored in the ROM at a rate controlled by the CLOCK signal. In order to access the ROM 218, the CPU activates the $\overline{MREQ}$ signal supplied to the memory select chip 222 and specifies the address of the ROM through the AB1-3–AB15 signals. As a result, a ROM enable ("$\overline{RO\ MEN}$") signal produced by the memory select chip 222 is activated, thus allowing communication between the CPU and the ROM. In order to access the RAM 220, the CPU activates the $\overline{MREQ}$ signal supplied to the memory select chip 222 and specifies the address of the RAM through the AB13–AB15 signals. As a result, a RAM enable ("$\overline{RAMEN}$") signal produced by the memory select chip 222 is activated, thus allowing the CPU to either store information in the RAM or retrieve information from the RAM, depending on whether the $\overline{WR}$ signal supplied to the RAM from the CPU is activated.

Figure 14:
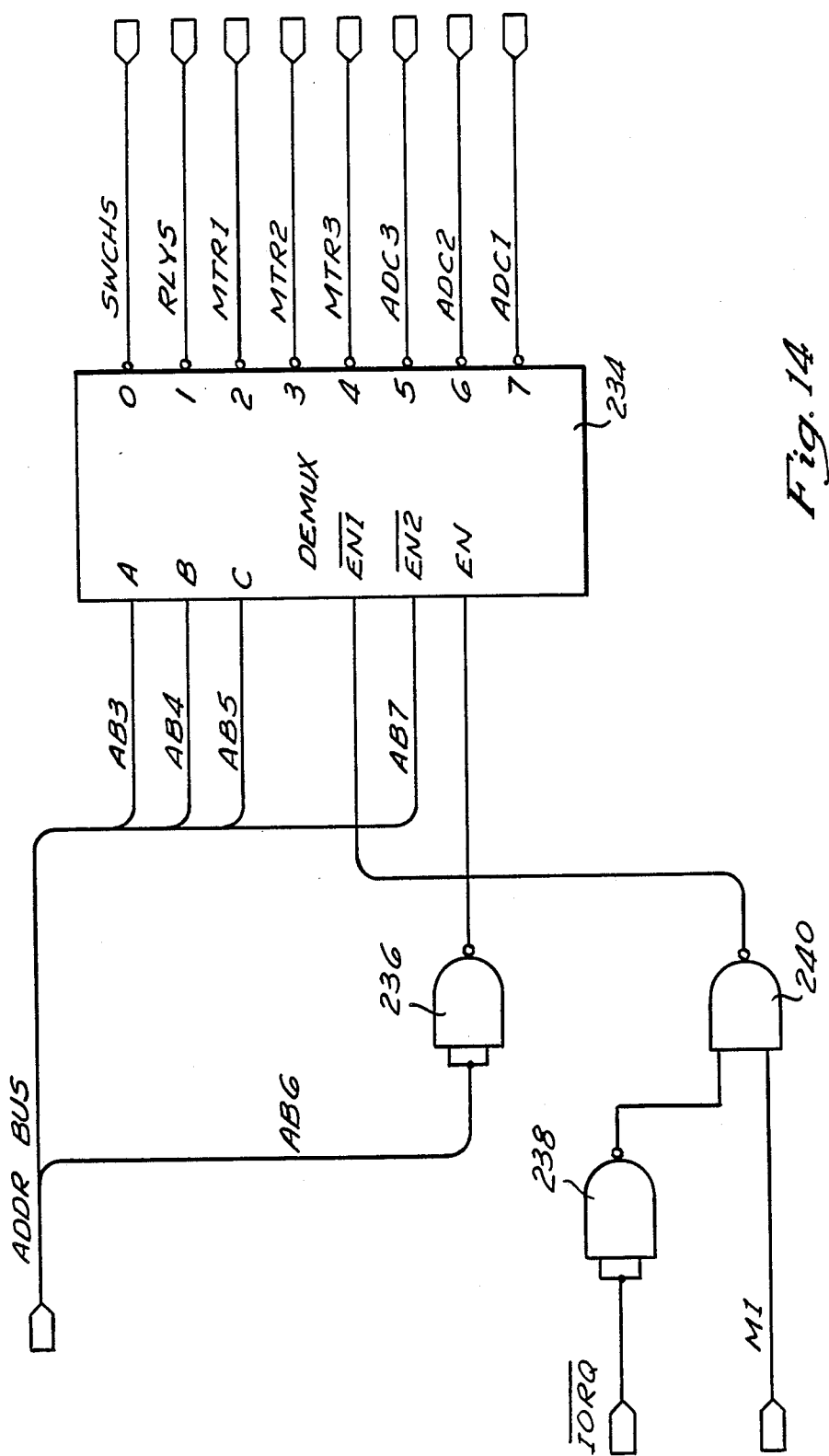
FIG. 14 is a circuit diagram of the I/O interface of FIG. 12.

The I/O interface 202 is shown in detail in FIG. 14. The purpose of the I/O interface 202 is to selectively establish a communication link between the controller 200 and the buffer 206, the driver 210, one of the motor drivers 212, or one of the A/D converters 214 of FIG. 12. The I/O interface 202 consists of a three-to-eight demultiplexer 234 along with three NAND gates 236, 238, 240. The demultiplexer 234 is selectively enabled for operation by the transmission to the demultiplexer 234 by the CPU of the AB6, $\overline{IORQ}$, and $\overline{M1}$ signals. When enabled, the demultiplexer 234 accepts the AB-3–AB5 signals and selectively generates exactly one active output depending upon the values of the AB-3–AB5 signals. The eight outputs of the demultiplexer 234 include a switch activation ("SWCHS") signal line, a relay activation ("RLYS") signal line, three motor activation ("MTR1-MR3") signal lines, and three A/D converter activation ("ADC1-ADC3") signal lines. The SWCHS signal is supplied to and controls the activation of the buffer 206 shown in more detail in FIG. 16. The RLYS signal controls the activation of the pneumatics driver 210 of FIG. 15. The three MTR1, MR2 and MTR3 signals are supplied to the three motor drivers 212, one of which is illustrated in detail in FIG. 17, and the ADC1, ADC2 and ADC3 signals are supplied to the three A/D converters 214, one of which is shown in detail in FIG. 18. Thus, depending upon the values of the AB3–AB5 signals supplied to the demultiplexer 234, exactly one of the circuits mentioned above is enabled for communication to the controller 200.

Now referring to FIG. 15, the pneumatics driver 210 is shown in detail. The driver 210 comprises a latch 242 coupled to four field effect transistors 244, 246, 248, 250 through four resistors 252, 254, 256, 258. The latch 242 is a conventional 74374 integrated circuit chip. The transistors 244, 246 control the clamping and the unclamping of the sheet of material within the punch, and the two transistors 248, 250 control the punching of holes in the sheet of material. When activated by the RLYS signal generated by the I/O interface 202, the latch 242 selectively energizes the four transistors 244, 246, 248, 250 depending upon the values of the DB4–DB7 signals supplied to the latch 242. Thus, for example, when the DB4–DB7 signals have one set of values, the punch 20 clamps the sheet of material; upon a second set of values, the punch unclamps the sheet of material; and so on. Once a particular set of values are sent to the latch 242 via the DB4–DB7 lines, the latch 242 retains the values and energizes the transistors 244, 246, 248, 250 in accordance with those values until a new set of values are transmitted to the latch 242. Thus, for example, when a "clamp command" is transmitted to the latch 242 via the DB4–DB7 lines, the punch 20 clamps the sheet of material until an "unclamp command" is transmitted to the latch 242.

As shown in FIG. 12, each of the three motor drivers 212 is connected to a respective stepping motor 76. One of the motor drivers 212 is shown in detail in FIG. 17. The motor driver 212 consists of a latch 260 coupled to four field effect transistors 262, 264, 266, 268 through four resistors 270, 272, 274, 276. The four transistors 262, 264, 266, 268 are connected to the conventional four-phase stepping motor 76, each transistor being connected to a respective winding in the motor 76. The latch 260 is a conventional 74175 integrated circuit chip. Although different from the pneumatics latch 242, the latch 260 operates in substantially the same way. When activated by the MTR1 signal, the latch 260 selectively energizes the four transistors 262, 264, 266, 268 depending upon the values of the DB3–DB6 signals supplied to the latch 260. The values of the DB3–DB6 control the position of the rotor within each stepping motor 76. One set of DB3–DB6 values holds the rotor in one position; a second set of values holds the rotor in a second position; a third set of values holds the rotor in a third position; and so on. Thus, in order to drive the stepping motor 76 through a series of positions, a series of different sets of DB3–DB6 values are supplied to the latch 260. Each stepping motor 76 may be driven in either a forward or a reverse direction by supplying appropriate sequences of DB3–DB6 values to the latch 260.

The interconnections of the buffer 206 are shown in detail in FIG. 16. The buffer 206 is a conventional 74244 integrated circuit chip. The buffer 206 is connected to the three home position switches (not shown) and the two tray-in and tray-out switches (not shown). The buffer 206, which is activated by the SWCHS signal produced by the I/O interface 202, passes the values generated by the home switches and the tray switches to the DB0–DB4 lines. The values generated by each switch depend on whether the condition which it senses is true. For example, the tray-in switch generates an active signal when the tray 28 is located within the punching chamber and an inactive signal at all other times. As a result, the controller 200 can at any time detect whether the tray 28 is in by activating the SWCHS signal and reading the appropriate DB0–DB4 signal.

The interconnections of one of the four A/D converters 214 is shown in detail in FIG. 18. The A/D converter 214, which is a conventional 0804 integrated circuit chip, is connected to and reads the voltage developed across the photodetector 148 of one of the photosensors 146 and outputs on the lines DB0–DB7 the digital representation of the voltage. Each photodetector 148 generates a voltage which corresponds to the light intensity detected from its respective photoemitter 150. As is explained in more detail below, the light intensity detected varies depending upon the position of each reference mark 10 relative to the position of the photosensor 146. The A/D converter 214 is activated by the ADC1 signal generated by the I/O interface 202.

Figure 19:
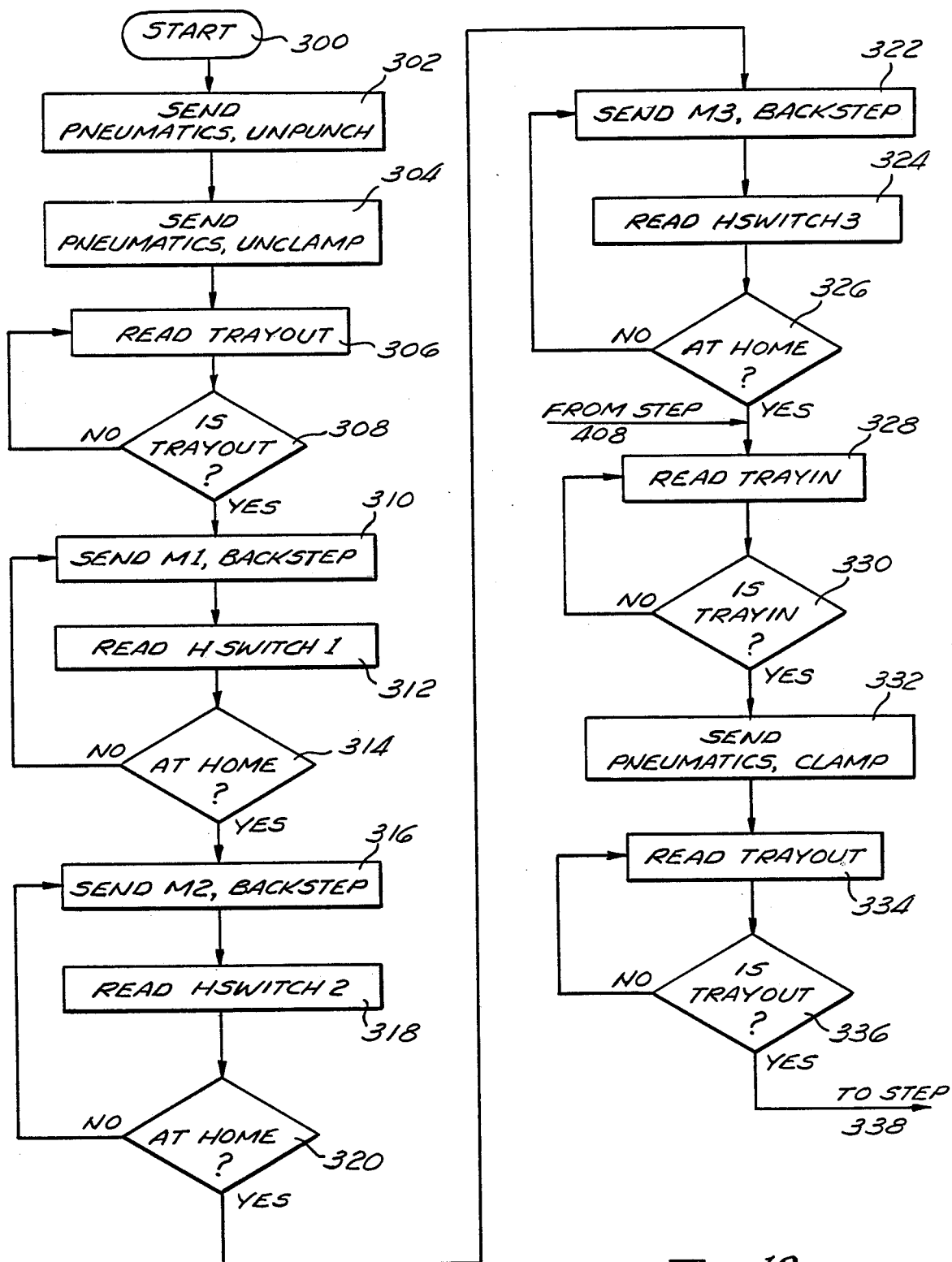
FIGS. 19-21 show a functional flowchart of the computer program used in connection with the controller of FIG. 13.

As described above, a computer program is stored in the ROM 218 and executed by the CPU 216 during the operation of the punch 20. This computer program is provided below in Table 1. A functional diagram of the computer program is shown in detail in FIGS. 19-21, and the operation of the punch is described in detail below with reference to FIGS. 19-24.

Initially, the operator turns on the punch 20, and the execution of the computer program by the CPU 216 begins at step 300. Upon power up, the punch performs several preliminary operations which include making sure that the four punch bits 132 are removed from their respective die bushings 140 so that they do not obstruct the entry of the sheet of material into the punching chamber between the stripper plate 38 and the sheet positioning plate 68. To this end, a step 302, the controller 200 sends an UNPUNCH command to the pneumatics. This command is executed by includes activating the RLYS signal and sending the appropriate DB4–DB7 values to the latch to cause the punch pneumatics to "unpunch."

Another preliminary step, undertaken to ensure that the sheet of material can be inserted into the punching chamber, causes the punch to be in an "unclamped" position in which there is an opening between the stripper plate 38 and the sheet positioning plate 68. Thus, at step 304, an UNCLAMP command is sent to the pneumatics by activating the RLYS signal and sending the appropriate DB4–DB7 values to the latch 242 to cause the punch pneumatics 208 to "unclamp."

The punch then moves the sheet positioning plate 68 to a predetermined starting location, or "home," prior to the insertion of each sheet of material. However, before the plate 68 is moved home, the punch makes sure that the tray 28 has been pulled out so that it does not interfere with the movement of the plate 68. This is accomplished by reading the tray-out switch at step 306 to determine if the tray 28 has been pulled out. The controller 200 reads the tray-out switch by activating the SWCHS signal supplied to the latch 242 and determining the value of the appropriate DB3–DB4 signal. If the value of the signal indicates that the tray 28 has not been pulled out, which is determined at step 308, then steps 306–308 are repeated until it is detected that the tray 28 has been pulled out.

The punch then moves the sheet positioning plate 68 home. In order to move the plate 68 home, the plate 68 is moved by the positioning cams 72 until each of the three home position switches indicates that the plate 68 is at home, or precisely positioned in its starting position. This process is accomplished in steps 310–326 in FIG. 19. At step 310, the controller 200 sends a BACKSTEP command the first of the three stopping motors 76 in order to cause the motor 76 to move a first part of the plate 68 towards home. This step is executed by the controller 200 by activating the MTR1 signal and sending the necessary DB3–DB6 signals to drive the motor 76 one step. Then, at step 312, the controller 200 "reads" the first home switch. This step is performed by activating the SWCHS signal supplied to the buffer 206 and reading the values of the DB0–DB3 signals. If the first part of the plate 68 is not at home, then steps 310–314 are repeated until it is determined that the first part of the plate 68 is at home. If the first part is at home, steps 316–320 are performed by the controller 200. Steps 316–230 are analogous to steps 310–314, and cause a second part of the plate 68 to be moved by the second stepping motor 76 to "home" as detected by the second home switch. Steps 322–326 are also analogous to steps 310–314, and cause a third part of the plate 68 to be moved by the third stepping motor 76 to "home" as detected by the third home switch. As a result of steps 310–326, the sheet positioning plate 68 is moved to a precise location in the punch.

A sheet of material is then loaded into the tray 28 and manually inserted into the punching chamber by the operator. While the operator is busy loading the tray 28, the punch has no operations to perform, so it simply waits until the tray-in switch indicates that the operator has pushed the tray 28 in. This tray-in waiting period is accomplished by steps 328–330, which are analogous to steps 306–308.

After the punch senses that the tray 28 has been pushed in by the operator, the punch clamps the sheet of material in place at step 332 by sending a CLAMP command to the pneumatics. This is accomplished by activating the RLYS signal provided to the latch 242 and sending the appropriate values of the DB4–DB5 signals to the latch 242. After the sheet of material is clamped into place between the sheet positioning plate 68 and the stripper plate 38, the operator pulls the tray 28 out. Since the sheet guide 56 and the tray guides 54 interfere with the positioning of the sheet of material when the tray 28 is in, the punch waits until the operator pulls the tray 28 out before starting to automatically position the sheet of material. This waiting period is performed at steps 334–336, which are functionally identical to steps 306–308.

FIG. 22a illustrates the starting location of each sheet of material in the punch after each sheet is inserted into the punching chamber and clamped between the sheet positioning plate 68 and the stripper plate 38. Each sheet is placed in the punching chamber in this precise position by means of the sheet guide 56 and the abutment of the tray 28 against the stripper plate 38 when the tray 28 is pushed in by the operator. FIG. 22a is a top view of the position of a sheet of material with respect to the three photosensors 146 to the punch. The sheet of material has the two reference marks 10a, 10b which appear to be horizontal in FIG. 21a and the one 10c which appears to be vertical. The large arrow indicates the direction of insertion of the sheet into the punching chamber. After the sheet is inserted into the punching chamber and clamped to the sheet positioning plate 68, the two reference marks 10a, 10b are situated behind the two photosensors 146a, 146b and the vertical appearing reference mark 10c lies to the left-hand side of the third photosensors 146c.

The automatic positioning of the sheet of material within the punch is achieved by the cooperation of the photosensors 146 and the reference marks 10. In one embodiment, the photosensors 146 are located in the punch in order to detect the intensity of the light reflected from the metallized reference marks 10. The position of each reference mark 10 relative to the position of a photosensor 146 affects the intensity of light detected. In this embodiment, the photoemitters 150 and photodetectors 148 of the photosensors 146 are located on the same side of the sheet of material to be punched, and each photodetector 148 is located in a position such that it detects the light emitted by its respective photoemitter 150 after the light is reflected by the surface of the sheet of material. Generally, most sheets of material reflect a minimum amount of light. However, since the reference marks 10 on the sheets of material are metallizations having highly reflective surfaces, when the light emitted by one of the photoemitters 150 is reflected from a reference mark, the amount of light detected by its corresponding photodetector 148 greatly increases. Thus, each photosensor 146 is capable of detecting the presence of a respective reference mark.

FIG. 22b illustrates this relationship between the amount of light detected by each photosensor 146 and the relative position of its respective reference mark 10. FIGS. 22b is a graph of light intensity versus relative reference mark 10 position. When a reference mark 10 is not positioned close to its respective photosensor 146, which is the case on the curve in the portion of the graph to the left of point A, the photosensor 146 detects only a minimal light intensity due to the non-metallized surface of the sheet of material. Point P indicates the light intensity detected when the sheet of material positioned is in FIG. 22a. Moving from left to right on the curve, at the position indicated by point A, the metallized surface of the reference mark 10 is close enough to its respective photosensor 146 to begin to increase the light intensity detected by the photosensor 146. As the reference mark is moved closer to the photosensor, the detected light intensity begins to increase, the increases to a maximum when the reference mark 10 is at the position indicated at point B. Moving further to the right along the curve, the light intensity stays relatively constant when the reference mark 10 is positioned directly underneath the photosensor 146. The photosensor 146 senses a light intensity on the curve between A and B when an edge of a reference mark 10 is detected, and it senses a light intensity on the curve to the right of point B when an interior portion of a reference mark between its two edges is detected.

During movement of the sheet of material in the punching chamber, each of the three photosensors 146 in the punch continuously generates a signal which corresponds to its detected light intensity. By measuring the magnitude of each generated signal, the controller 200 can detect whether each of the three reference marks 10 is properly aligned with respect to the photosensors 146. Depending upon the magnitude of each signal measured, the controller selectively drives the three stepping motors 76 so that the reference marks 10 on the sheet of material are brought into proper alignment prior to the sheet of material being punched.

Figure 20:
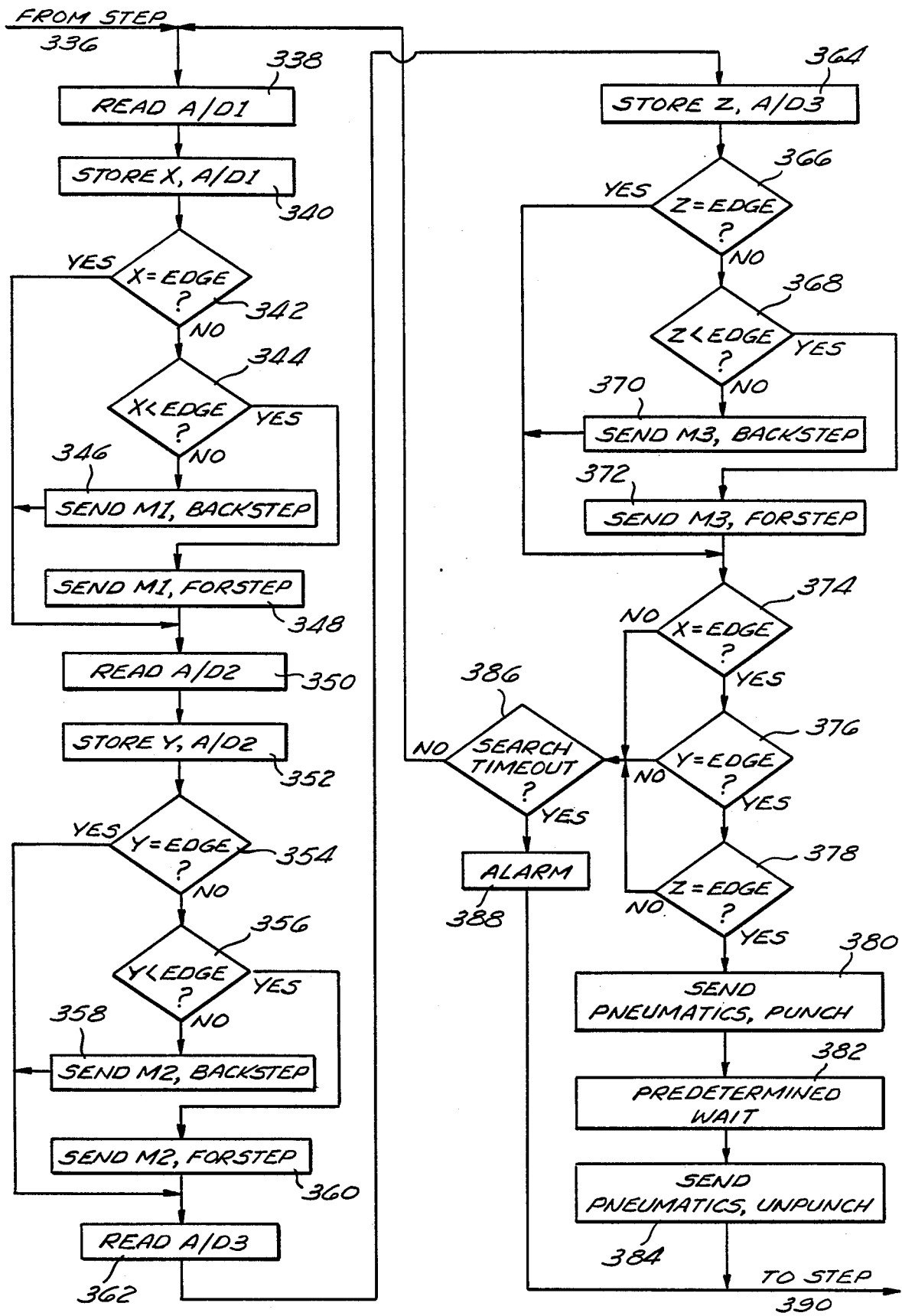
Figure 21:
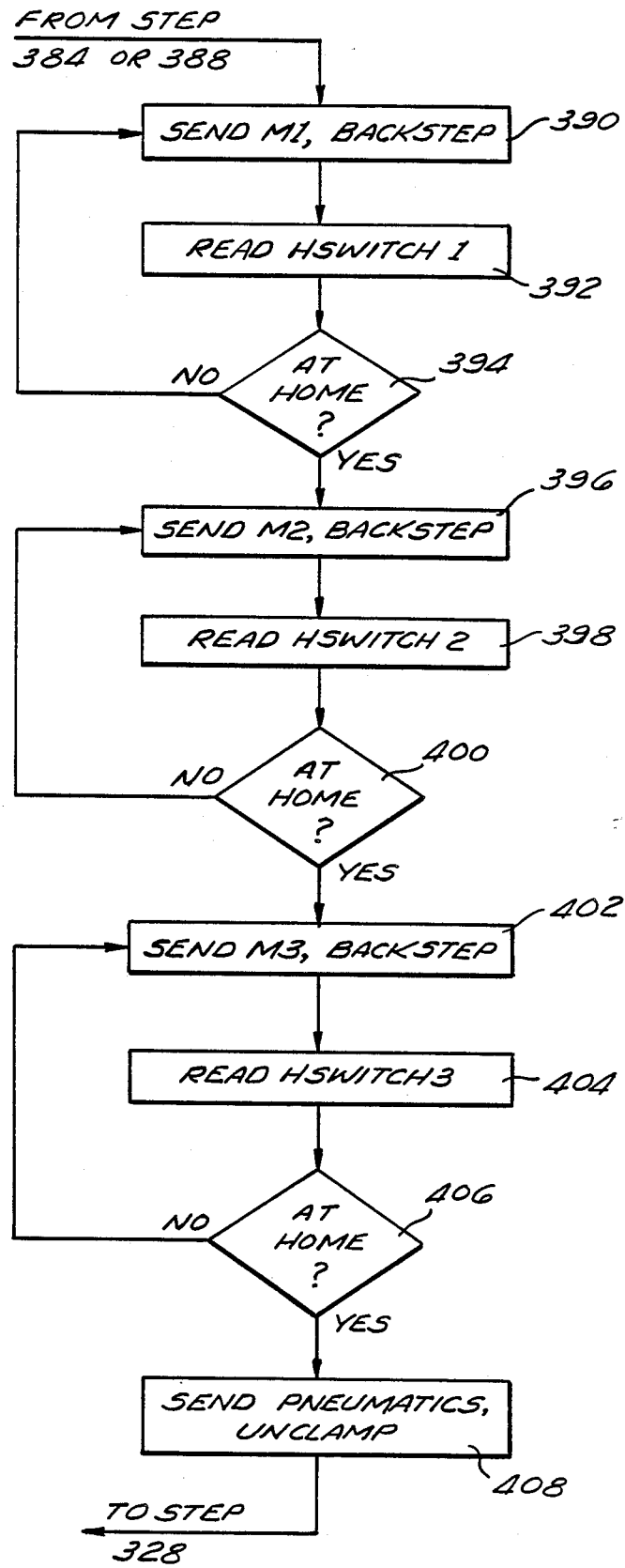

The portion of the computer program which controls this automatic positioning and punching is shown in FIG. 20. The signal from each of the three photosensors 146 is sampled and measured, and each corresponding stepping motor 76 is driven a single step in a direction which would tend to properly align its corresponding reference mark 10 to the respective photosensor 146. If a reference mark is detected to be in alignment, its respective stepping motor 76 is not driven. After the signal generated by photosensor 146 is measured and the motors 76 are appropriately driven, the controller 200 checks to detemine whether all the reference marks are properly aligned. If they are, the sheet of material is punched.

Now referring to FIG. 20, steps 338-348 cause the first photosensor 146 to be sampled and its respective motor 76 to be driven in the proper direction. At step 338, the controller 200 reads the first photosensor 146 signal value input to the first A/D converter by activating the ADC1 signal, then at step 340 this value is stored. Next, at steps 342 and 344, the stored value is compared with EDGE, which designates a predetermined range of numeric values having a lower limit and an upper limit, as shown in FIG. 22b. If the stored value equals EDGE, signifying that the stored value is within the range of numeric values, then the program branches to step 350 since the reference mark is properly aligned and the first stepping motor 76 does not need to be driven. If the stored value is less than EDGE, signifying that the light intensity lies on the curve of FIG. 22b to the left of the lower threshold limit, the first motor 76 is given a forward step.

A forward step is defined as either one which moves the sheet of material towards the forward portion of the punch or one which moves the sheet to the right, which is indicated by the three small arrows in FIG. 22a. A backward step is defined as one which moves the sheet of material in the opposite directions. As shown in FIG. 22b, if the light intensity is too low, then a foward step is needed to move the reference mark to its desired position between the upper and lower limits. If the stored value corresponding to the light intensity is too large, indicating that the light intensity lies on the curve of FIG. 22b to the right of the upper threshold limit, then a backward step is given to the first motor 76 at step 346 after which the program branches to step 350.

Steps 350-360 are analogous to steps 338-348, as described above, except that a second of the three photosensors 146 is sampled and the corresponding stepping motor 76 is driven. Steps 362-372 are also analogous to step 338-348, but cause the third photosensor 146 to be sampled and the third stepping motor 76 to be driven.

The next portion of the program determines whether all three of the reference marks are in proper alignment with their respective photosensors 146. Step 374, which is identical to step 342, determines whether the first reference mark is properly aligned with the first photosensor 146. If it is properly aligned, then at step 376 it is determined whether the second reference mark is properly aligned. If the second mark is aligned as well, at step 378, it is determined whether the third mark is properly aligned. If all three reference marks are properly aligned, the program branches to step 380, which causes the sheet of material to be punched. If any one of the three reference marks are not properly aligned, the program branches to step 386.

The position of a sheet of material having each of its three reference marks 10 properly positioned with respect to the three photosensors 146 is shown in FIG. 23a. Each of the photosensors 146 is relatively positioned to detect a respective edge of each of the reference marks 10. The light intensity thus detected is shown to be at point P on the curve of FIG. 23b between the upper and lower threshold limits.

At step 386, the program compares the time that has elapsed during the positioning of the current sheet of material and compares this time to a predetermined time threshold. If the elapsed time exceeds the threshold, then a brief audible alarm is sounded at step 388, and the program bypasses the punching step 380. If the elapsed time does not exceed the threshold, then the program returns to step 338 in order to repeat the positioning steps 338-372. The purpose of limiting the positioning time of a sheet of material is to avoid undesirable delays. For example, if the operator placed a sheet of material into the punch with the reference marks facing the wrong direction, the punch would never be able to position the sheet correctly, and valuable punch operation time would be wasted until the operator determined something was wrong.

When each of the three reference marks is properly positioned, at step 380 the sheet of material is punched by the activation of the RLYS signal and the transmission to the latch 242 of the appropriate DB6-DB7 signals. At step 382, the controller 200 waits a predetermined period of time, and then at step 384 to the four punch bits 132 are retracted from the sheet of material by sending to the hydraulics an UNPUNCH command, which is carried out by activating the RLYS signal and transmitting the appropriate DB6–DB7 signals to the latch 242.

After the sheet of material is punched, the sheet positioning plate 68 is moved back to its initial starting position, or home position. This is carried out by steps 390–406 of the program, which are functionally identical to the steps 310–326 as described above. After the sheet positioning plate 68 is moved to home, the sheet of material is unclamped at step 408 and then the computer program branches to step 328 in order to wait for the operator to insert the next sheet of material into the punching chamber. Upon insertion of the new sheet of material the punched sheet is automatically ejected from the punching chamber by the two sheet ejectors 60 after they are raised by the magnetic attraction of the two magnets 62. The punch then processes the new sheet of material in accordance with the procedure described above.

An alternative method of positioning the sheet of material than the method described above is explained with reference to FIGS. 24a and 24b. Instead of positioning each sheet of material with respect to a predetermined edge of each of the reference marks, the approximate center of each reference mark 10 is aligned with a respective photosensor 146. The position of a sheet of material having its reference marks so positioned with respect to the photosensors is shown in FIG. 24a. Each reference mark 10 is approximately centered with respect to its corresponding photosensor 146. The light intensity detected by each of the photosensors of FIG. 24a is shown to be at point P on the curve of FIG. 24b midway between points $E_1$ and $E_2$.

In order to move the sheet of material to its final position as reflected by FIGS. 24a and 24b, a number of additional steps are performed. When each of the photosensors detects a light intensity at point $E_1$ on the curve of FIG. 24b, which corresponds to a first edge of a reference mark, the current position of each of the stepping motors is stored in the RAM as a number of steps through which each motor moved from its initial starting position, when the sheet was positioned as in FIG. 22a. After these three numbers are stored, the second edge of each of the reference marks is then detected, which is indicated by point $E_2$ on the curve of FIG. 24b. At this point, the position of each of the three stepping motors is again stored, as described above. In order to move the sheet of material to its position as indicated in FIG. 24a, each of the stepping motors is driven a number of steps in accordance with the following formula:

$$STEPS = (E_2 - E_1)/2,$$

where $E_2$ is the number of steps stored when the light intensity at point $E_2$ on the curve in FIG. 24b was detected and $E_1$ is the number of steps stored when the detected light intensity corresponded to point $E_1$ on the curve. As a result of driving each stepping motor this number of STEPS, the sheet will be positioned in accordance with FIG. 24a. This alternate method of positioning each sheet of material is advantageous in that it averages sheet positioning errors which result from uneven edges of the reference marks.

Another embodiment of the punch 20 incorporates a different type of photosensor. As explained above, each of the photosensors 146 detects the light reflected from a sheet of material. Thus, these photosensors 146 are advantageous for detecting the shiny surfaces of metallized reference marks. However, as explained above, it is also advantageous to detect photographic images of reference marks formed on photoprint film for purpose of punching alignment holes. Because these reference mark images are not highly reflective, a different type of photosensor is used.

Now referring to FIG. 11, an alternative embodiment of a photosensor is shown. The photosensor 410 comprises a photoemitter 412 and a photodetector 414. The photodetector 414 has a cylindrical metal cover 416 having a slot 418 formed therein. The cover 416 holds the slot 418 in a fixed position over the photodetector 414. A sheet of material 420 having a mark 422 is shown positioned between the photoemitter 412 and the cover 416. The slot 418 has a shape which conforms to that of the reference mark 422.

When the photosensor 410 is operated, the photodetector 414 detects the intensity of the light emitted by the photoemitter 412 which passes through the translucent sheet of material 420. When the reference mark 422 begins to overlap the slot 418, the intensity of the detected light changes. Thus, the photodetector 414 accurately detects the relative position of the reference mark 422. The reference mark 422 detected in this manner may be a reference mark image on a photoprint film, or it may be a metallized reference mark since a metallized reference mark would also alter the light intensity detected by the detector 414.

Many modifications could be made to the embodiments of the invention described herein while still retaining the benefits of the invention. For example, the mechanics of the sheet positioning system could be substantially changed while retaining the advantages of the automatic punching of patterns of holes in precise locations as described herein. A different number and arrangement of reference marks could be used. Furthermore, the benefits of the invention could be realized even if no reference marks were used. In this case, a feature of the photographic image of the circuitry of the metallized circuitry itself could be detected instead of reference marks. Also, many different types of photosensors could be used while still retaining the benefits of the invention.

Further modifications and alternative embodiments of the invention will be apparent to those skilled in the art in view of the foregoing description. Accordingly, this description is to be construed as illustrative only, and is for the purposes of teaching those skilled in the art the best mode of carrying out the invention. The details of the structure may be varied substantially without departing from the spirit of the invention, and the exclusive use of all modifications which come within the scope of the appended claims is reserved.

What is claimed is:

1. An automatic optical registration punch for punching a pattern of holes in a sheet of material having metallized circuitry formed thereon, said hole pattern being punched at a precise position determined with respect to the position of said metallized circuitry on said sheet of material, said punch comprising:

a photoemitter for emitting light on said sheet of material;

a photodetector positioned to detect the light emitted by said photoemitter, the intensity of the detected light being indicative of the relative position of said metallized circuitry on said sheet of material within said punch, said photoemitter and said photodetector being located on the same side of said sheet of material, the light detected by said photodetector being emitted by said photoemitter;

an automatic sheet positioner coupled to said photodetector, said sheet positioner automatically positioning said sheet of material in response to the intensity of the light detected by said photodetector;

punching means coupled to said photodetector for punching a predetermined pattern of holes in said sheet of material in response to said photodetector detecting a predetermined light intensity indicating that said metallized circuitry on said sheet of material occupies a predetermined position with respect to said punching means, said punching means punching said pattern of holes in said sheet of material in response to said photodetector detecting both edges of said reference mark; and an automatic sheet ejector which automatically ejects a sheet of punched material from said punch upon the insertion into said punch of an unpunched sheet of material.

2. An apparatus as defined in claim 1, wherein said predetermined light intensity includes all light intensities which fall within a range having a predetermined lower threshold and a predetermined upper threshold.

3. An apparatus as defined in claim 1, wherein said punch punches said pattern of holes in said sheet of material in response to said photodetector detecting an edge of said reference mark.

4. An apparatus as defined in claim 1, wherein said reference mark has at least two edges and wherein said punch punches said pattern of holes in said sheet of material in response to said photodetector detecting both edges of said reference mark.

5. An apparatus for punching holes at precise locations in sheets of material, said apparatus comprising:
a photoemitter for emitting light on a sheet of material;
a photodetector positioned to detect the light emitted by said photoemitter, the intensity of the detected light being indicative of the relative position of said sheet of material in said apparatus;
an automatic sheet positioner coupled to said photodetector, said sheet positioner automatically positioning said sheet of material in response to the intensity of the light detected by said photodetector;
a punch coupled to said photodetector, said punch punching a pattern of holes in said sheet of material in response to said photodetector detecting a predetermined intensity of light; and
an automatic sheet ejector which automatically ejects a punched sheet of material from said apparatus upon the insertion into said apparatus of an unpunched sheet of material;
said sheet of material having a reference mark having two edges, said reference mark altering the intensity of the light detected by said photodetector when said reference mark is moved relative to said photoemitter;
said punch punching said pattern of holes in said sheet of material in response to said photodetector detecting both edges of said reference mark.

6. An apparatus as defined in claim 5, wherein said automatic sheet ejector comprises a pair of magnets which raise a pair of pivotal arms, said raised arms forcing said punched sheet of material from said apparatus when said unpunched sheet of material is inserted.

7. An apparatus for punching holes at precise locations in sheets of material, said apparatus comprising:
means for emitting light on a sheet of material;
means for detecting the light emitted by said light emitting means, the intensity of the detected light being indicative of the relative position of said sheet of material in said apparatus, each of said sheets of materials having at least one reference mark which alters the intensity of the light detected by said detecting means when said reference mark is moved relative to said emitting means;
means for automatically positioning said sheet of material in response to the intensity of the light detected by said detecting means;
means for punching a predetermined pattern of holes in said sheet of material upon detection by said detecting means of a predetermined intensity of light wherein an edge of said reference mark is detected by said detecting means; and
means for automatically ejecting a punched sheet of material from said apparatus upon insertion into said apparatus of an unpunched sheet of material.

8. An apparatus for punching holes at precise locations in sheets of material, said apparatus comprising:
means for emitting light on a sheet of material;
means for detecting the light emitted by said light emitting means, the intensity of the detected light being indicative of the relative position of said sheet of material in said apparatus, said sheet of material having a first reference mark which alters the intensity of the light detected by said detecting means when said reference mark is moved relative to said emitting means and having a second reference mark, each of said reference marks being detected in order to align said sheet of material in a respective direction;
means for automatically positioning said sheet of material in response to the intensity of the light detected by said detecting means, said means for automatically positioning said sheet of material comprising:
first means for incrementally moving said sheet of material in a first direction;
second means for incrementally moving said sheet of material in a second direction opposite said first direction, each of said moving means comprising a positioning cam;
a first stepping motor coupled to drive said first moving means; and
a second stepping motor coupled to drive said second moving means; and
means for punching a predetermined pattern of holes in said sheet of material upon said detecting means detecting a predetermined intensity of light.

9. A method of automatically punching holes at precise locations in sheets of material, said method comprising the steps of:
(a) emitting light on a sheet of material;
(b) detecting the light emitted in said step (a), the amount of detected light being indicative of a feature of said sheet of material, the light detected in said step (b) being reflected from the surface of said sheet of material;

(c) automatically positioning said sheet of material in response to the amount of light detected in said step (b);

(d) punching a pattern of holes in said sheet of material upon the detection in said step (b) of a predetermined light intensity; and (e) ejecting a punched sheet of material upon the insertion of an unpunched sheet of material; said feature of said sheet of material being a reference mark having two edges, said reference mark altering the intensity of the light detected in said step (b), both edges of said reference mark being detected in said step (b).

10. A method as defined in claim 9, wherein said sheet of material is a laminate sheet used in the manufacture of a multilayer printed circuit board.

* * * * *

UNITED STATES PATENT AND TRADEMARK OFFICE
CERTIFICATE OF CORRECTION

| | |
|---|---|
| PATENT NO. | : 4,817,477 |
| DATED | : April 4, 1989 |
| INVENTOR(S) | : Jack K. Emery, et al. |

It is certified that error appears in the above-identified patent and that said Letters Patent is hereby corrected as shown below:

At column 6, line 1, change "ths" to --the--.

At column 9, line 33, change "MTR1-MR3" to --MTR1-MTR3--.

At column 9, line 39, change "MR2" to --MTR2--.

At column 11, line 9, change "a step" to --at step--.

At column 11, line 47, change "stopping motors" to --stepping motors--.

At column 11, line 60, change "316-230" to --316-320--.

At column 12, line 34, change "146 to" to --146 of--.

At columm 13, line 18, change "increase, the increases" to --increase, and increases--.

At column 18, line 23, change "wherein" to --whereby--.

Signed and Sealed this

Seventh Day of August, 1990

*Attest:*

HARRY F. MANBECK, JR.

*Attesting Officer*     *Commissioner of Patents and Trademarks*